United States Patent
Raming et al.

(10) Patent No.: US 8,357,590 B2
(45) Date of Patent: Jan. 22, 2013

(54) METHOD FOR PRODUCING SEMICONDUCTOR WAFERS COMPOSED OF SILICON HAVING A DIAMETER OF AT LEAST 450 MM, AND SEMICONDUCTOR WAFER COMPOSED OF SILICON HAVING A DIAMETER OF 450 MM

(75) Inventors: Georg Raming, Tann (DE); Walter Heuwieser, Stammham (DE); Andreas Sattler, Trostberg (DE); Alfred Miller, Emmerting (DE)

(73) Assignee: Siltronic AG, Munich (DE)

( * ) Notice: Subject to any disclaimer, the term of this patent is extended or adjusted under 35 U.S.C. 154(b) by 27 days.

(21) Appl. No.: 13/005,584

(22) Filed: Jan. 13, 2011

(65) Prior Publication Data
US 2011/0175202 A1    Jul. 21, 2011

(30) Foreign Application Priority Data
Jan. 20, 2010   (DE) .......................... 10 2010 005 100

(51) Int. Cl.
*H01L 21/46* (2006.01)
(52) U.S. Cl. . 438/460; 438/478; 257/617; 257/E29.109; 257/E21.599
(58) Field of Classification Search .................. 438/460, 438/478; 257/671, E29.109, E21.599
See application file for complete search history.

(56) References Cited

U.S. PATENT DOCUMENTS

| | | | |
|---|---|---|---|
| 6,548,035 B1 | 4/2003 | Kimura et al. | |
| 2008/0153261 A1 | 6/2008 | Weber et al. | |
| 2009/0293802 A1 | 12/2009 | Taguchi et al. | |

FOREIGN PATENT DOCUMENTS

| | | |
|---|---|---|
| DE | 102006060359 A1 | 6/2008 |
| JP | 11180793 A | 7/1999 |
| JP | 2003277185 A | 10/2003 |
| JP | 2004002064 A | 1/2004 |
| JP | 2009292682 A | 12/2009 |
| WO | 2009104534 A1 | 8/2009 |

OTHER PUBLICATIONS

Y. Shiraishi et al., "Growth of Silicon Crystal with a Diameter of 400 mm and weight of 400 kg"., Journal of Crystal Growth 229 (2001) 17-21.

*Primary Examiner* — Long Pham
(74) *Attorney, Agent, or Firm* — Brooks Kushman P.C.

(57) ABSTRACT

Silicon semiconductor wafers are produced by:
  pulling a single crystal with a conical section and an adjoining cylindrical section having a diameter ≧450 mm and a length of ≧800 mm from a melt in a crucible, wherein in pulling the transition from the conical section to the cylindrical section, the pulling rate is at least 1.8 times higher than the average pulling rate during the pulling of the cylindrical section;
  cooling the growing single crystal with a cooling power of at least 20 kW;
  feeding heat from the side wall of the crucible to the single crystal, wherein a gap having a height of ≧70 mm is present between a heat shield surrounding the single crystal and the melt surface.

2 Claims, 6 Drawing Sheets

METHOD FOR PRODUCING SEMICONDUCTOR WAFERS COMPOSED OF SILICON HAVING A DIAMETER OF AT LEAST 450 MM, AND SEMICONDUCTOR WAFER COMPOSED OF SILICON HAVING A DIAMETER OF 450 MM

CROSS-REFERENCE TO RELATED APPLICATION

This application claims priority to German Patent Application No. 10 2010 005 100.4 filed Jan. 20, 2010 which is herein incorporated by reference.

BACKGROUND OF THE INVENTION

1. Field of the Invention

The invention relates to a method for producing semiconductor wafers composed of silicon having a diameter of at least 450 mm and having defect properties which make such semiconductor wafers suitable for use as substrates for the production of electronic components. The invention also relates to a semiconductor wafer composed of silicon having a diameter of 450 mm.

2. Background Art

Semiconductor wafers composed of silicon having a nominal diameter of 450 mm are currently being developed as substrates for the next generation. The developers are faced with a great challenge since the jump in diameter from 300 mm to 450 mm requires far more than simple adaptation and optimization of known production methods. One particular challenge consists of achieving the quality preferred at diameters of 300 mm, in particular with regard to defect properties. There is interest in defect properties in particular for defects brought about by accumulations of lattice vacancies to ("v-defects" hereinafter), or by accumulation of interstitial silicon, ("i-defects" hereinafter), and with regard to defects such as BMD ("bulk micro defects") and OSF ("oxidation induced stacking faults"), in the formation of which oxygen precipitation plays an important part.

WO 2009/104534 A1 is representative of prior art showing that the jump in diameter from 300 mm to 450 mm has already been accomplished.

The report by Shiraishi et al., JOURNAL OF CRYSTAL GROWTH 229 (2001) 17-21, summarizes experience gained in the course of the development of a method for producing single crystals composed of silicon having a diameter of 400 mm. This experience includes the fact that it was not possible to produce semiconductor wafers which were free of defects or which exhibited a defect profile that is uniform over The diameter.

SUMMARY OF THE INVENTION

An object of the present invention is to provide a method for producing semiconductor wafers composed of silicon in high yields and with economic pulling rates, the semiconductor wafers having a diameter of at least 450 mm and a defect profile that is uniform over the diameter. These and other objects are achieved by a method for producing semiconductor wafers comprising pulling a single crystal with a conical section having an increasing diameter and an adjoining cylindrical section having a diameter of at least 450 mm and a length of at least 800 mm from a melt contained in a crucible, at a pulling rate which, in the course of pulling the transition from the conical section to the cylindrical section, is at least 1.8 times higher than the average pulling rate during the pulling of the cylindrical section; cooling the growing single crystal with a cooling power of at least 20 kW; feeding heat from the side wall of the crucible to the growing single crystal, wherein a gap having a height of at least 70 mm is present between a heat shield surrounding the growing single crystal and the surface of the melt; and slicing semiconductor wafers from the cylindrical section, wherein a plurality of the semiconductor wafers have a region with v-defects that extends from the center of the semiconductor wafers to as the edge of the semiconductor wafers.

DETAILED DESCRIPTION OF THE PREFERRED EMBODIMENTS

The plurality of the semiconductor wafers having a diameter of at least 450 mm that are produced with the aid of the method are distinguished by a defect region with v-defects that extends from the center of a semiconductor wafer to the edge thereof. In the case of these semiconductor wafers, the average density of OSF defects is preferably not more than 6 $cm^{-2}$, more preferably not more than 2 $cm^{-2}$, and most preferably not more than 0.5 $cm^{-2}$. The radial variation of the resistivity is preferably not more than 10%, more preferably not more than 5%, and most preferably not more than 2%. The radial variation of the oxygen concentration ROV is preferably not more than 12%, more preferably not more than 8%, and most preferably not more than 4%. The semiconductor wafers can be used directly or after the deposition of an epitaxial layer as substrates for producing electronic components.

In order to be able to produce corresponding single crystals with an economic pulling rate of at least 0.5 mm/min with high yields, it is necessary to take account of some preconditions with regard to the furnace configuration ("hot zone") and with regard to some process implementation parameters.

Figure 1:
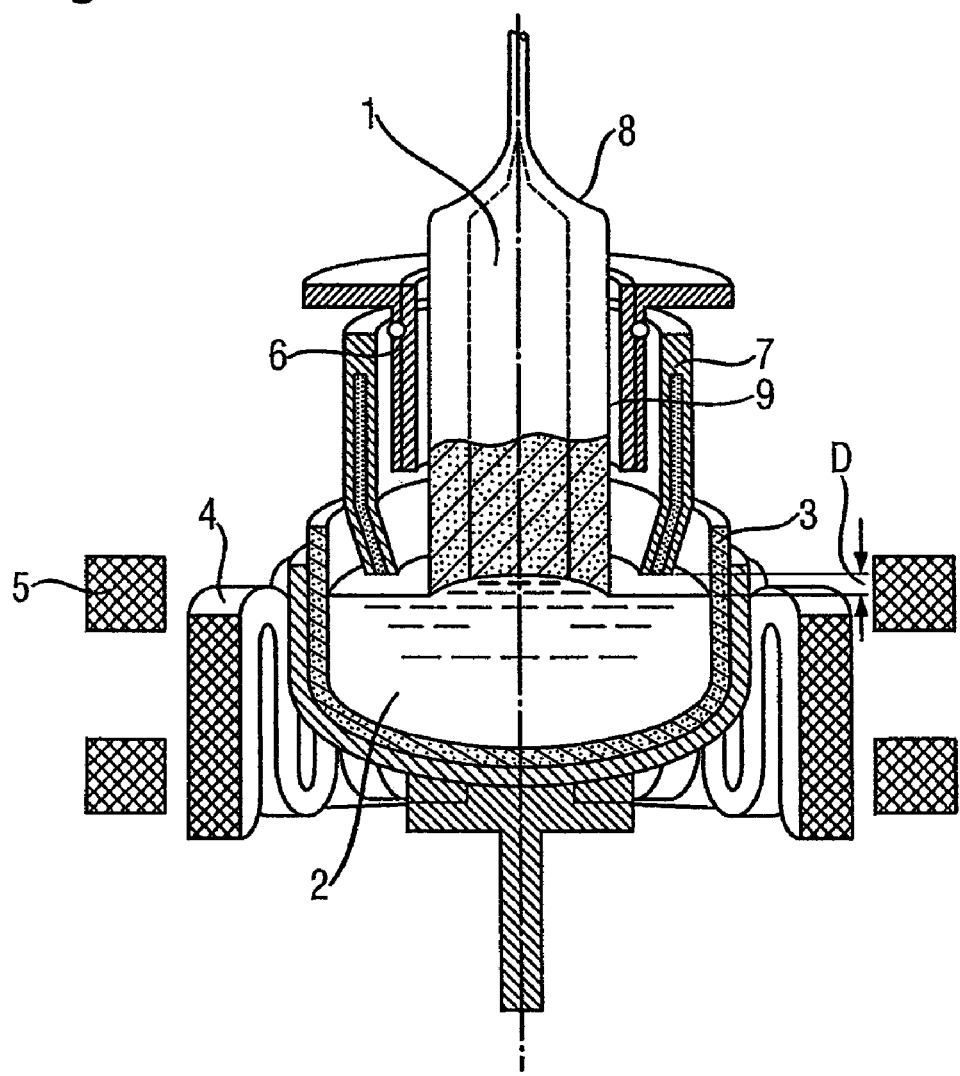
FIG. 1 illustrates one embodiment of a hot zone useful in the inventive method.

FIG. 1 shows a "hot zone" suitable for carrying out the method. The single crystal 1 is pulled from a melt 2 contained in a crucible 3. Arranged around the crucible is a resistance heater 4, with the aid of which the melt is kept liquid. A magnetic field, for example a Cusp field or a horizontal magnetic field, can be impressed on the melt 2. A device 5 for generating the magnetic field is present for this purpose. The single crystal 1 is surrounded by a cooler 6 and a heat shield 7. The heat shield 7 has an end section that is tapered conically toward the single crystal. The bottom surface at the lower end of the end section of the heat shield 7 is at a distance D from the surface of the melt 2. A gap having a height corresponding to the distance D is therefore present between the heat shield 7 and the surface of the melt.

As has been shown by experiments conducted by the inventors, the yield of dislocation-free single crystals falls significantly if the pulling rate when pulling the transition from the conical section 8 to the cylindrical section 9 of the single crystal is not significantly higher than the average pulling rate during the growth of the cylindrical section 9 of the single crystal 1. In order largely to avoid losses of yield as a result of dislocation formation, the pulling rate during the pulling of the transition from the conical section 8 to the cylindrical section 9 of the single crystal, that is to say from the point in time at which the conical section has reached approximately 30% of the desired diameter of the cylindrical section until the point in time at which the desired diameter is reached, should be at least 1.8 times, preferably 1.8 to 3 times, higher than the average pulling rate during the pulling of the cylindrical section of the single crystal.

The average pulling rate during the pulling of the cylindrical section of the single crystal is preferably not less than 0.5 mm/min, more preferably not less than 0.65 mm/min.

In order that a single crystal composed of silicon having a diameter of at least 450 mm can be pulled with a pulling rate of not less than 0.5 mm/min, the heat of crystallization that arises has to be effectively dissipated. It has been ascertained that the required cooling power of the cooler 6 has to be at least 20 kW. It is advantageous if the emissivity of that inner surface of the cooler 6 which faces the single crystal is as high as possible, such that thermal radiation coming from the single crystal is effectively absorbed. The inner surface of the cooler can therefore be coated with a heat-absorbing layer, preferably a graphite layer. The outwardly facing surface of the cooler 6 is preferably polished, in order that thermal radiation impinging there is effectively reflected and does not burden the cooler.

Furthermore, care should be taken to ensure that the thermal loading experienced by the growing single crystal as a result of the cooling does not bring about thermal stresses whose nature is such that they destroy the single crystal. The experiments conducted by the inventors have shown that the thermal loading should be prevented from bringing about a van Mises stress of more than 35 MPa. The following parameters were used to calculate the van Mises stress: modulus of elasticity=150 GPa, an extension coefficient at room temperature of 2.6e–6 1/K and a Poisson ratio of 0.25. It was found that the resulting thermal loading remains non-critical if the distance D between the bottom surface at the lower end of the end section of the heat shield 7 and the surface of the melt 2 is not less than 70 mm.

A distance D of not less than 70 mm is also necessary in order that the axial temperature gradient G at the phase boundary between the melt 2 and the growing single crystal 1 is approximately identical in the center and at the edge of the single crystal. The growth rate v of the single crystal and the axial temperature gradient G are, in the form of the quotient v/G, those variables which are crucial with regard to whether an excess of vacancies or an excess of interstitial silicon arises in the single crystal. If, by way of example, the intention is to prevent vacancies from dominating in the center of the single crystal and interstitial silicon from dominating at the edge of the single crystal, it is necessary to implement a measure against the usually occurring situation in which the axial temperature gradient increases significantly from the center of the single crystal to the edge of the single crystal. In the case of single crystals having a relatively large diameter, the axial temperature gradient in the center $G_c$ is usually significantly less than the axial temperature gradient at the edge $G_e$ of the single crystal, because heat is emitted from the edge of the single crystal. If the distance D between the bottom surface at the lower end of the end section of the heat shield 7 and the surface of the melt 2 is not less than 70 mm, enough heat can pass from the side wall of the crucible 3 to the edge of the phase boundary, such that $G_e$ is matched to $G_c$.

EXAMPLE

Figure 2:
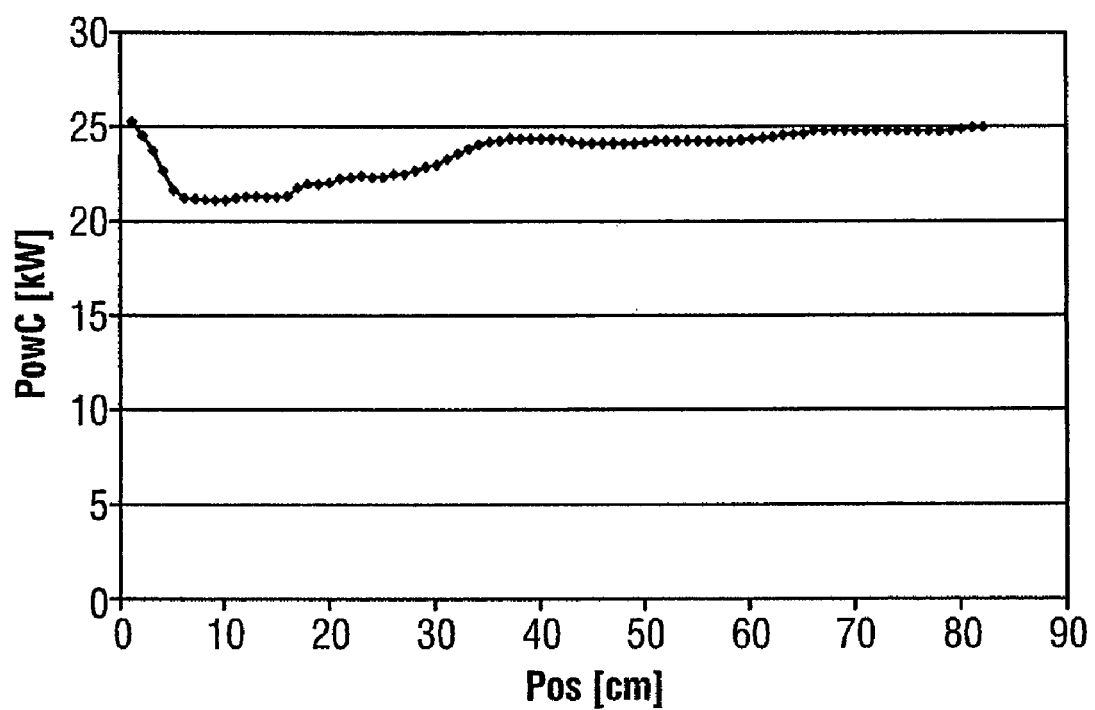
FIG. 2 illustrates one example of cooling power at various positions of single crystal during pulling of a single crystal.
Figure 3:
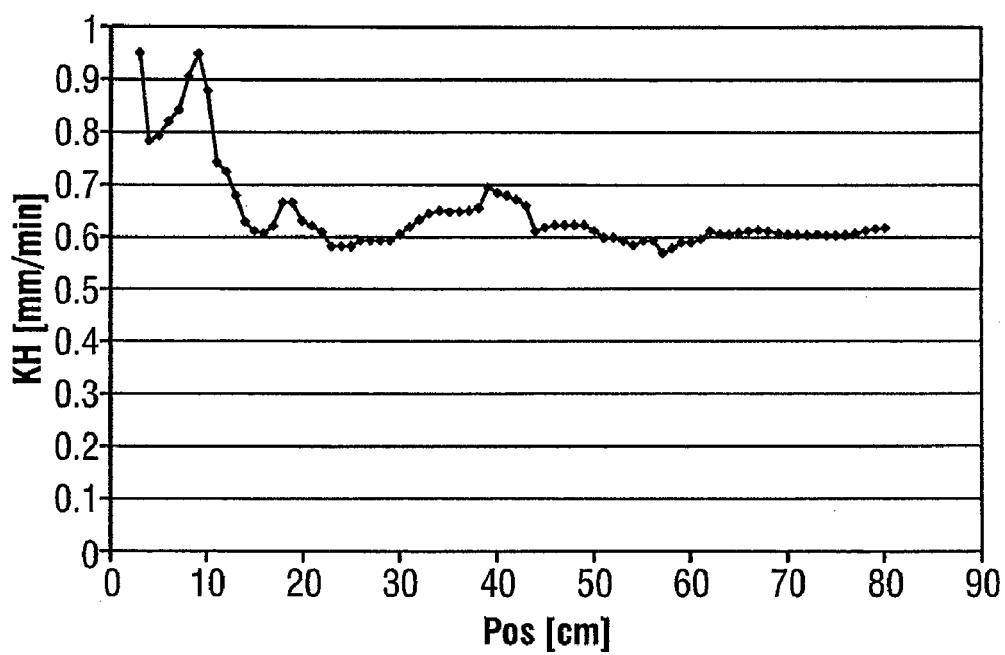
FIG. 3 illustrates on embodiment of pulling rate versus single crystal length, showing the higher inventive pull rate during transition from the conical to cylindrical section.

A single crystal having a diameter of 450 mm in the cylindrical section was pulled using the method. The cylindrical section had a length of 800 mm. The "hot zone" had the features illustrated in FIG. 1. During the pulling of the single crystal, argon at a pressure of 2800 Pa (28 mbar) was passed through the "hot zone" at a rate of 165 1/min. A horizontal magnetic field having a flux density of 270 mT was impressed on the melt. The distance D between the bottom surface at the lower end of the end section of the heat shield 7 and the surface of the melt 2 was 70 mm. The cooler 6 had an inner surface blackened with graphite, and a polished outer surface. The cooling power was on average in the region of 24 kW. FIG. 2 shows the profile of the cooling power PowC as a function of the position POS—indicated in length units—in the cylindrical section of the single crystal. During the pulling of the cylindrical section, the average pulling rate was 0.65 mm/min. FIG. 3 shows the profile of the pulling rate KH as a function of the position POS in the cylindrical section of the single crystal. During the pulling of the transition from the conical section to the cylindrical section of the single crystal, the pulling rate was 1.8 times higher than the average pulling rate of 0.65 mm/min. The single crystal and the crucible were rotated in opposite directions at a speed of 7 rpm and 0.3 rpm, respectively.

Afterward, the cylindrical section of the single crystal was processed to form semiconductor wafers composed of silicon and important properties of the semiconductor wafers were examined.

Figure 4:
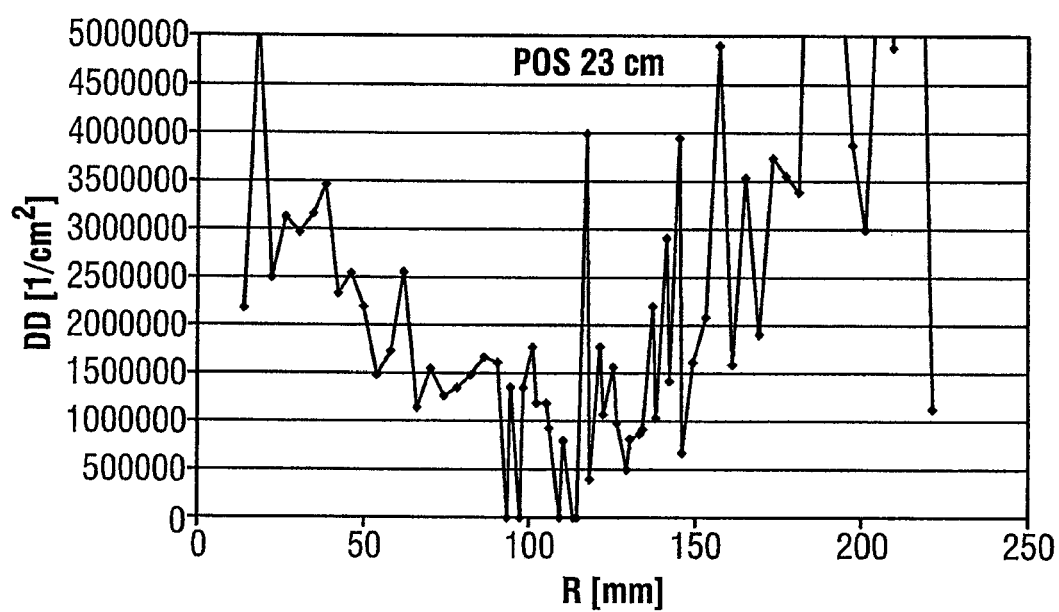
FIG. 4 illustrates radial variation of defects at the 23 cm position of the single crystal, measured by laser light scattering.
Figure 5:
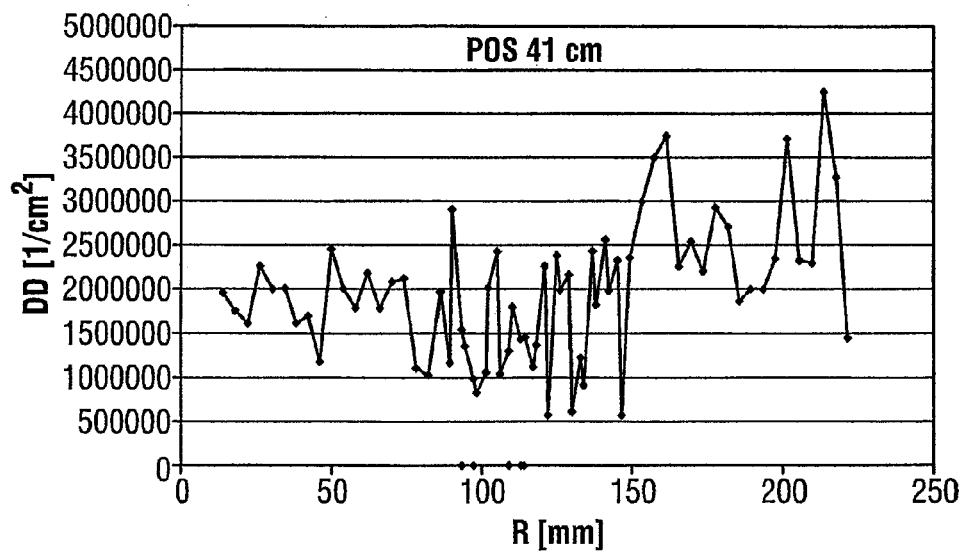
FIG. 5 illustrates radial variation of defects at the 41 cm position of the single crystal, measured by laser light scattering.
Figure 6:
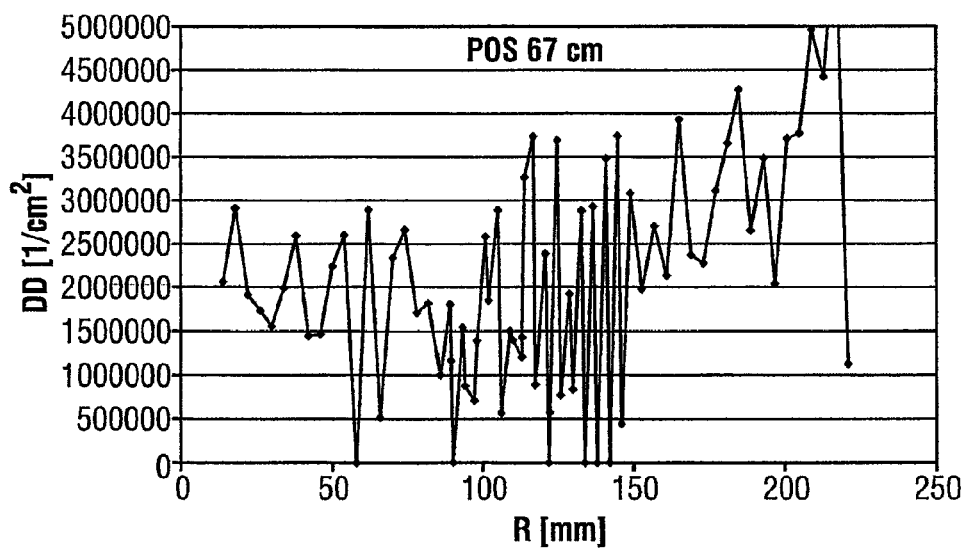
FIG. 6 illustrates radial variation of defects at the 67 cm position of the single crystal, measured by laser light scattering.

FIG. 4 to FIG. 6 show the result of laser scattered light measurements which were carried out using a measuring device of the MO-4 type from Mitsui Mining & Smelting, on the basis of the example of three semiconductor wafers that originated from the first, second and third thirds of the cylindrical section (POS 23 cm, POS 41 cm and POS 67 cm). The scattered light measurements show the density DD of v-defects as a function of the radius R of the semiconductor wafers. It can be discerned that the semiconductor wafers have independently of the position in the cylindrical section a region with v-defects that extends from the center to the edge of the semiconductor wafers.

The following table lists the average density of OSF defects of semiconductor wafers, which were counted after wet oxidation and thermal treatment at 1100° C. lasting for 120 min, and the positions of the semiconductor wafers in the cylindrical section of the single crystal.

TABLE

| Position [cm] | OSF [$cm^{-2}$] |
|---|---|
| 12.0 | 5.3 |
| 23.0 | 0.5 |
| 30.0 | 0.5 |
| 41.0 | 1 |
| 51.0 | 0.5 |
| 67.0 | 0 |

The radial variation of the resistivity was on average less than 2%. The resistivity decreased, owing to segregation, from approximately 17.2 ohm cm at the start of the cylindrical section to approximately 13.9 ohm cm at the end of the cylindrical section.

Figure 7:
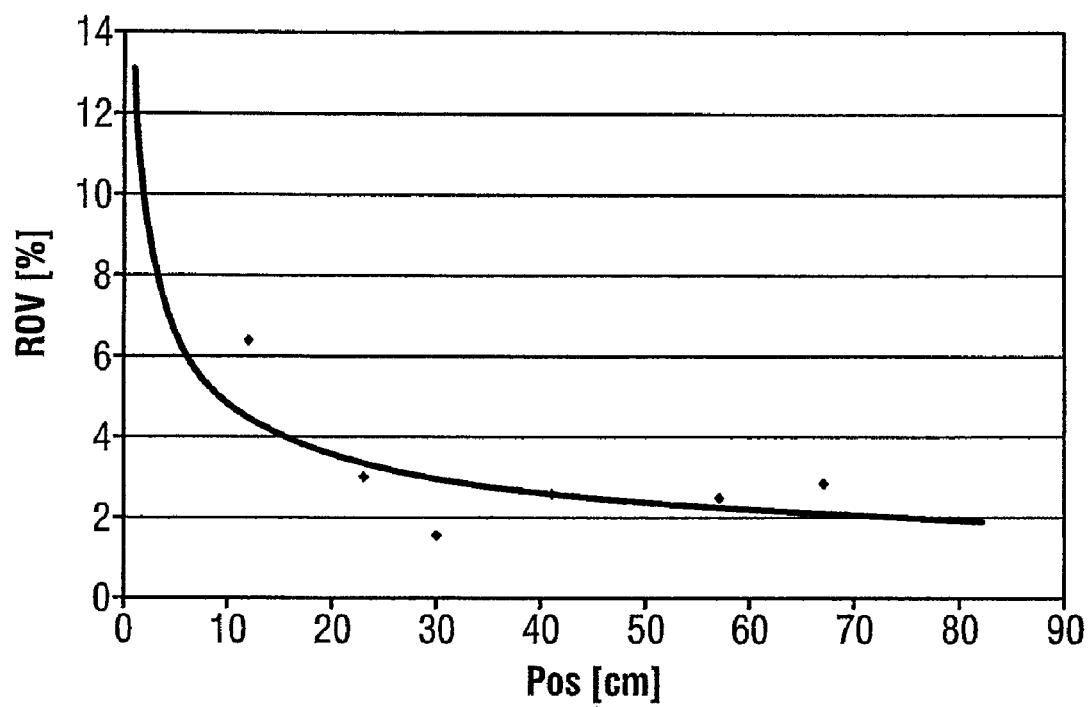
FIG. 7 illustrates radial variation of oxygen concentration relative to position in the single crystal.

FIG. 7 shows the radial variation of the oxygen concentration ROV, measured according to New ASTM, as a function of the position POS in the cylindrical section of the single crystal. The oxygen concentration decreased axially from approximately $9.5 \cdot 10^{17}$ atom/cm$^3$ at the start of the cylindrical section to approximately $5.3 \cdot 10^{17}$ atom/cm$^3$ at the end of the cylindrical section.

A charge carrier lifetime measurement—making visible the curvature of the phase boundary between the single crystal and the melt—after a thermal treatment that formed oxygen precipitates revealed that the phase boundary at position 210 mm of the cylindrical section was curved convexly in relation to the single crystal, with a curvature of 27 mm in the center of the phase boundary.

What is claimed is:

1. A method for producing semiconductor wafers composed of silicon, comprising:

pulling a single crystal with a conical section having an increasing diameter and an adjoining cylindrical section having a diameter of at least 450 mm and a length of at least 800 mm from a melt contained in a crucible, at a pulling rate which, in the course of pulling the transition from the conical section to the cylindrical section, is at least 1.8 times higher than the average pulling rate during the pulling of the cylindrical section;

cooling the growing single crystal with a cooling power of at least 20 kW;

feeding heat from the side wall of the crucible to the growing single crystal, wherein a gap having a height of at least 70 mm is present between a heat shield surrounding the growing single crystal and the surface of the melt; and slicing semiconductor wafers from the cylindrical section, wherein a plurality of the semiconductor wafers have a region with v-defects that extends from the center of the semiconductor wafers to the edge of the semiconductor wafers.

2. The method of claim 1, wherein the single crystal is pulled at an average pulling rate of not less than 0.5 mm/min during the pulling of the cylindrical section.

* * * * *